US 9,748,734 B1

(12) United States Patent
Stiffler et al.

(10) Patent No.: US 9,748,734 B1
(45) Date of Patent: Aug. 29, 2017

(54) APPARATUS AND METHOD FOR DRIVING LASER DIODE ARRAYS WITH HIGH-POWER PULSED CURRENTS USING LOW-SIDE LINEAR DRIVE WITH LASER DIODE ARRAY PROTECTION AND POWER EFFICIENCY MONITORING AND ADJUSTMENT

(71) Applicant: Raytheon Company, Waltham, MA (US)

(72) Inventors: Robert F. Stiffler, Lakewood, CA (US); Michael S. Lackey, Torrance, CA (US); Thomas H. Alford, Lomita, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/203,390

(22) Filed: Jul. 6, 2016

(51) Int. Cl.
*H01S 5/042* (2006.01)
*H01S 5/40* (2006.01)
*H01S 3/23* (2006.01)
*H01S 3/0941* (2006.01)

(52) U.S. Cl.
CPC ............ *H01S 5/042* (2013.01); *H01S 3/0941* (2013.01); *H01S 3/2308* (2013.01); *H01S 5/4025* (2013.01)

(58) Field of Classification Search
CPC ...... H01S 5/042; H01S 3/0941; H01S 3/2308; H01S 5/4025
See application file for complete search history.

(56) References Cited

U.S. PATENT DOCUMENTS

| 4,968,941 | A | * | 11/1990 | Rogers | .................. | H02J 7/1423 |
| | | | | | | 324/428 |
| 7,808,222 | B2 | | 10/2010 | Ueunten | | |
| 8,080,985 | B2 | | 12/2011 | Ueunten | | |
| 9,001,857 | B2 | * | 4/2015 | Lackey | .................... | H03K 3/57 |
| | | | | | | 250/205 |
| 2006/0291512 | A1 | | 12/2006 | Borschowa | | |
| 2009/0073829 | A1 | * | 3/2009 | Rees | ...................... | G11B 7/126 |
| | | | | | | 369/47.15 |
| 2011/0163682 | A1 | | 7/2011 | Jungwirth | | |
| 2013/0119948 | A1 | * | 5/2013 | Bekiarov | .................. | H02P 9/48 |
| | | | | | | 322/24 |

FOREIGN PATENT DOCUMENTS

EP 0374607 A1 6/1990

OTHER PUBLICATIONS

International Search Report and Written Opinion from related Application No. PCT/US2017/022131 issued May 31, 2017.

* cited by examiner

*Primary Examiner* — Xinning Niu
(74) *Attorney, Agent, or Firm* — Burns & Levinson LLP; Joseph M. Maraia

(57) ABSTRACT

A multi-stage laser drive circuit includes a variable common potential source, a PA light-emitting array between a storage capacitor and a current node, first and second low-side linear current sinks in electrical communication with the current node, and a second master oscillator (MO) light-emitting array in electrical communication between the current node and the first low side linear current sink. A trickle current circuit drives a low-value trickle current through the arrays, and a sense circuit senses the trickle current. Also, the headroom voltage across a pass element in the first low-side linear constant current sink is monitored and adjusted for maximum efficiency.

10 Claims, 5 Drawing Sheets

APPARATUS AND METHOD FOR DRIVING LASER DIODE ARRAYS WITH HIGH-POWER PULSED CURRENTS USING LOW-SIDE LINEAR DRIVE WITH LASER DIODE ARRAY PROTECTION AND POWER EFFICIENCY MONITORING AND ADJUSTMENT

BACKGROUND

1. Field of the Invention

The present disclosure is related to the field of laser diodes and, in particular, to a low-side laser diode driver with laser diode array protection and power efficiency monitoring and adjustment.

2. Discussion of Related Art

In order to pump single and/or multiple light-coupled laser gain media to high output light powers, high-current, e.g., one hundred amperes or more, laser diode arrays are typically required as the sources of pump light for the various laser gain media. These laser diodes are expensive and are very sensitive to signal or chassis ground shorts anywhere in the series laser array diode chain. Since these expensive laser diodes are usually tightly coupled to a chassis heat sink to lower their junction temperature, the probability of a chassis ground short to either the anode or cathode of the diode in question is a possibility.

A solution to laser diode array ground shorts is the use of high-side linear constant current sources or high-side switch-mode constant current sources. In these systems, when a short occurs, the high-side current source continues to pump the commanded high-side current pulses through the laser diodes above the short and then into the ground short and back to the return of the high-side current source. In these configurations, the laser diodes will not be damaged because the high-side current source continues to pump only the constant current pulses initially programmed. The laser diodes below the ground short cease to conduct any current at all.

There are at least three drawbacks to the high-side current source approach. Once a ground short occurs, the high-side driver continues to pump the high-current pulses even though the system has failed. Typically, the user is not immediately aware that a failure has occurred by looking at the high-side current source alone, unless some other failure detection system is present. The second drawback is that high-side drive is significantly more complex than the simpler linear low-side constant current sink approach. The third drawback is that, if the ground short occurs near the top of the diode string, most all of the input voltage appears across the high-side current source, thus greatly increasing the power dissipation within the high-side current source and potentially causing high-side current source failure.

SUMMARY

According to one aspect, a multi-stage laser drive circuit configured to draw current from a variable common potential source is provided. The circuit includes a current node and a first power amplifier (PA) light-emitting array in electrical communication between a storage capacitor and the current node through a digitally controllable ON/OFF switch, the storage capacitor being charged by the variable common potential source through a charge control circuit. The circuit further includes a first low side linear current sink in electrical communication with the current node, the first low side linear current sink being configured to draw a first current (I1=IMO) from the storage capacitor through the ON/OFF switch, through the current node. A second low side linear current sink is in electrical communication with the current node and in a parallel arrangement with respect to the first low side linear current sink, the second low side linear current sink being configured to draw a second current (I2=ISHUNT=IPA-IMO) from the storage capacitor through the ON/OFF switch, through the current node. A second master oscillator (MO) light-emitting array is in electrical communication between the current node and the first low side linear current sink. Current through the first light-emitting array is the sum of the first and second currents in parallel (I1+I2). Output light from the first PA light-emitting array is used to pump a first PA laser gain medium. Output light from the second MO light-emitting array is used to pump a second MO laser gain medium. A trickle current circuit is located between the common potential source output and an anode of a laser diode at a top of the first PA light-emitting array for driving a low-value trickle current through the first and second light emitting arrays and through a large fixed shunt resistor in parallel with the first low side linear current sink. A sense circuit senses a voltage indicative of a magnitude of the trickle current at an input of the first low side linear current sink and generates a signal indicative of the voltage. A digital controller generates a switch control signal to control the ON/OFF switch such that the first and second currents are prevented from flowing if the signal indicative of the trickle voltage indicates that the trickle voltage is outside a voltage range to indicate a malfunction, the malfunction being one of an open circuit and a short circuit, indicated by the trickle voltage.

In some exemplary embodiments, the first and second currents are arbitrary-waveform pulsed currents of low duty cycle, each pulse period comprising an ON time during which the current is controllable to flow as an arbitrary wave shape and an OFF time during which the current is controllable not to flow, each current being controllable by commands from the digital controller.

In some exemplary embodiments, the trickle current circuit comprises a single resistor or resistor/diode combination circuit between the common potential source output and the top of the first PA light-emitting array, the trickle current being used for testing status of both the first and second light-emitting arrays.

In some exemplary embodiments, the sense circuit comprises an analog-to-digital converter (ADC), which creates a trickle voltage digital value which is a proportional digital representation of the trickle voltage created by the trickle current flowing through the first low side linear current sink and the paralleled shunt resistor during the OFF time of the first low side linear current sink.

In some exemplary embodiments, the trickle voltage digital value is input to the digital controller, which determines if the trickle voltage is within a PASS or FAIL range to indicate a good or bad condition of at least one of the first PA light-emitting array and the second MO light emitting array. In some exemplary embodiments, if the trickle voltage digital value is in the FAIL range, the digital controller turns OFF the digitally controllable ON/OFF switch to shut down all current pulsing of the first and second light-emitting arrays.

In some exemplary embodiments, the first low side linear current sink contains a pass element and a second sense circuit, the second sense circuit sensing a voltage across the pass element and generating a signal indicative of the voltage across the pass element, the digital controller monitoring the voltage via an ADC and generating a digital control signal to vary an output of the common potential source to control the voltage across the pass element to an absolute minimum during the current pulse ON time, while maintaining pass element linearity. In some exemplary embodiments, the pass element comprises at least one of a Metal Oxide Semiconductor Field Effect Transistor (MOSFET), an Insulated Gate Bipolar Transistor (IGBT), and a similar device. In some exemplary embodiments, the voltage across the pass element is the source-drain voltage of the MOSFET or collector-emitter voltage of the IGBT and is monitored by a second ADC and is input to the digital controller as a headroom monitor (HRM) signal, a voltage of the HRM and the voltage across the pass element being linearly related by a gain stage, the gain stage making the voltage across the pass element being compatible with the second ADC. In some exemplary embodiments, the source-drain voltage of the MOSFET or collector-emitter voltage of an IGBT or similar device is monitored during every pulse cycle ON time and controlled on the fly during every pulse cycle OFF time such that the MOSFET, IGBT, or equivalent device operate in their linear operational mode at the lowest pass element Voltage possible for maximum efficiency. In some exemplary embodiments, monitoring of the trickle voltage via its sense circuit is conducted during each OFF time of the current pulse cycle, as close to the beginning of the pulse firing time of the light-emitting array as possible; and monitoring of the headroom voltage via its sense circuit is conducted during each ON time of the current pulse cycle, as close to the end of the pulse ON time as practical to compensate for storage capacitor droop.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
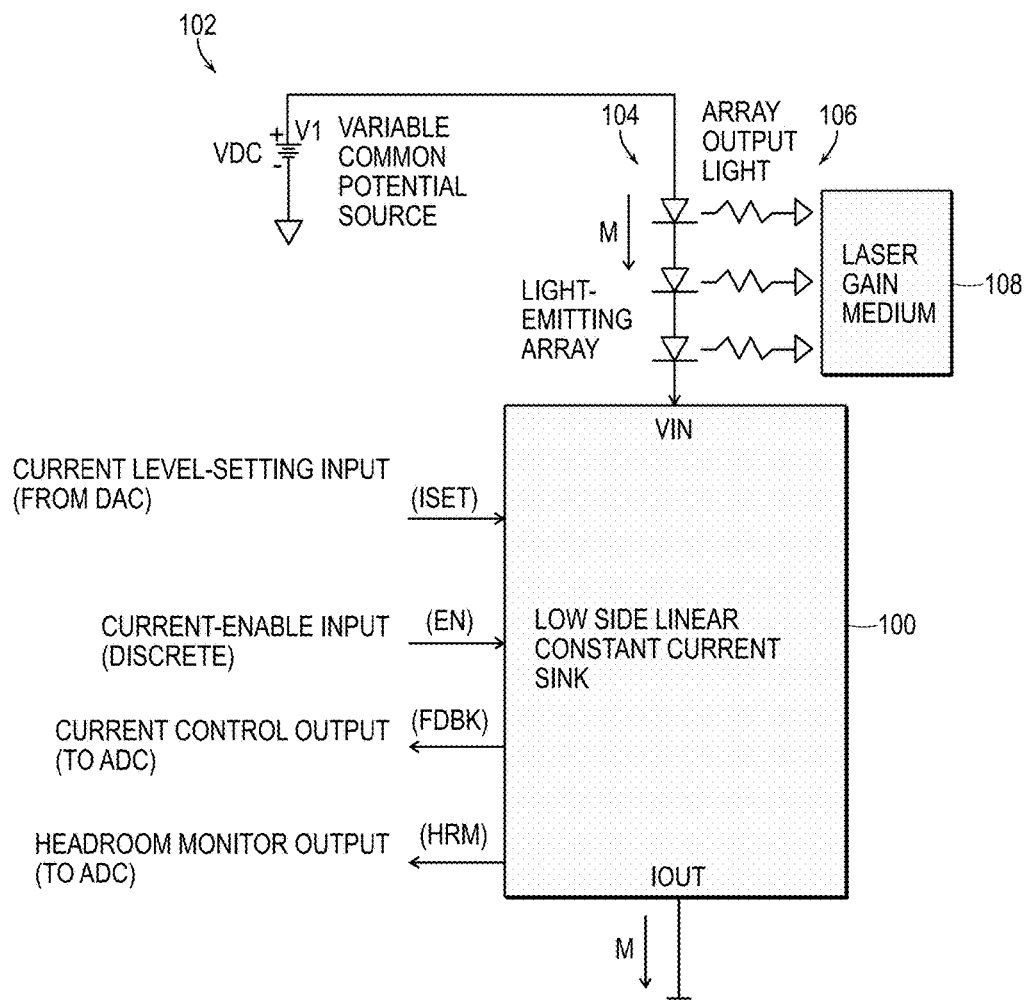
FIG. 1 includes a schematic functional block diagram illustrating a low-side linear constant current sink circuit, according to exemplary embodiments.

According to the exemplary embodiments described in detail herein, provided herein are devices, systems and methods for protecting series laser diode arrays from damage due to signal and chassis ground shorts, while simultaneously using low-side linear constant current sinks to drive the laser diode arrays, rather than high-side linear constant current sources. According to the exemplary embodiments, provided herein are assemblies and processes for activating various series arrays of laser light emitting diodes of one or more configurations, for example, a master oscillator (MO) configuration, a power oscillator (PO) configuration, and/or a power amplifier (PA) configuration, with low-side linear constant current sinks, while simultaneously protecting the laser diode arrays from damage caused by signal and chassis ground shorts. According to the exemplary embodiments, provided herein is an approach for driving laser diodes for the purpose of pumping up both single and multiple light-coupled laser gain media, such as POs, MOs, and PAs, in addition to their various combinations, e.g., MOPA, MOPAPA, etc., without damaging the expensive laser diodes. The present disclosure describes diode array protection and power efficiency monitoring and adjustment of high power MOPA light-coupled architectures and by extension MOPAPA architectures and beyond. A PO configuration of a single series diode array driven by a single or multiple low-side diode drivers in parallel is also within the scope of this disclosure.

According to some exemplary embodiments, a small trickle current is provided to the laser diode array. In one particular exemplary embodiment, only two electronic components are used to provide this trickle current. As a result of the trickle current, the series laser diode array is protected from ground shorts by monitoring the trickle current, and, if the trickle current indicates a ground short, completely shutting down the high-current drive, which can be one hundred amperes or more, to all laser diodes and providing notification of the failure to a system controller.

Described herein are embodiments of systems and techniques for activating light-emitting devices, such as laser diodes, as may be used in connection with pumping single or multiple optical gain media, such as PO, MOPA, MOPAPA, or larger, daisy-chained light-coupled gain medium architectures. The MOPA and MOPAPA light-coupled laser gain medium architectures are analogous to an RF power amplifier daisy chain including an oscillator driving a buffer amplifier, which in turn drives a high-power output amplifier into an RF radiating antenna. These various laser architectures are used to gradually step up the output light power from the final PA of the light-coupled gain medium chain.

U.S. Pat. No. 9,001,857 describes in detail exemplary PO, MOPA, and MOPAPA design architectures to which the current invention is applicable. That U.S. Patent is incorporated herein in its entirety by reference. The architectures described in the '857 Patent can be implemented using either high-side or low-side linear constant current sources/sinks. According to the present invention described herein in detail, the low-side approach is used, in connection with the trickle current monitoring and protection of the laser diodes, described herein in detail.

The basic building blocks for driving the PO, MOPA, and MOPAPA light-emitting arrays are either high-side linear constant current sources or low-side linear constant current sinks. These building blocks are usually closed loop, negative-feedback servo loops that control the current amplitude by modulating a pass element, which can be, for example, a power MOSFET, a power IGBT, a power bipolar transistor, or similar device, with the amplified difference between the current-level-setting input (ISET) and the current feedback voltage (FDBK) from the current sense element.

In general, the high-side linear constant current source differs somewhat from the low-side linear constant current sink in that it uses a floating power supply tied to the voltage output of a variable common potential source to power its internal electronics. This makes the high-side approach somewhat more complicated than the low-side approach. An advantage of the high-side approach is that the expensive laser diode arrays are protected in the case of wiring or ground shorts, because the commanded current is delivered regardless of load. If, however, the ground short occurs somewhere near the top of the laser diode array, the laser diode voltage is suddenly shifted across the high-side linear constant current source, thus greatly increasing the power dissipation and perhaps damaging the high-side linear constant current source. As the high-side linear constant current source is being damaged due to the increased power dissipation, it could possibly malfunction and destroy the laser diode array being driven. Thus, using high-side drive is not necessarily a fool-proof protection for the laser diode array.

In the past, considerable expense was incurred by damaging large series laser diode strings. Particular versions of these diode strings could cost 60 thousand dollars or more. The damage was caused by ground shorts in the laser diode array, while using low side, linear, constant current sinks. In such prior systems, there was no ability to limit the current from the charge capacitor, which dumped current directly down through the series laser diodes to the ground short. In an attempt to mitigate this problem, the low-side current sinks were replaced by high-side current sources. With this modification, in prior systems, there was no longer any expensive laser diode damage when a ground short occurred in the laser diode string. This is because, with high-side drive, the ground short only causes the pre-programmed current of the high-side driver to flow, regardless of where the short occurs in the laser diode string. The tradeoff of this solution is the high complexity and high cost of high-side drive, as contrasted with the preferred low-side drive.

A high-side linear constant current source is significantly more complex than a low-side linear constant current source. One reason for this is that the high side, linear, constant current source requires an extra internal isolated switching power supply to power its other internal blocks at an elevated voltage. The low-side, linear, constant current sink needs no such floating power supply and is powered by external system power. In short, the low side current sink design is simpler than the high side current source design and would be the preferred implementation, if it were not for the potential of laser diode ground shorts.

In accordance with embodiments of the invention, this advantage of the high-side approach is realized in a less complicated and less expensive low-side approach by adding a small number, e.g., two, relatively inexpensive components to drive a trickle current through the laser diode array and its associated wiring. If there is a short anywhere in the laser diode array or its associated wiring, or if there is an open anywhere in the laser diode array, the voltage at the top of the pass element in the first linear constant current sink will be significantly lower than normal. By monitoring the top of the pass element voltage prior to commanding the desired pass element current pulse, the ISET command can be zeroed and the current enable input (EN) can be deactivated, and an ON/OFF switch (see FIG. 2) can be placed in the OFF position to prevent pulsing of the wiring or ground short. An error signal generated by a controller informs the user and inhibits current pulsing until the wiring short or open is repaired. Thus, according to exemplary embodiments, the implementation of trickle current in laser diode arrays in conjunction with low-side linear constant current sinks provides substantial improvement over high-side linear constant current source drive.

Further detailed description of embodiments of systems and processes for activating light-emitting devices, such as laser diodes, as may be used in connection with an optical amplifier, follows. In particular, the advantages and disadvantages of using high side current sources or low side current sinks are described, especially as pertains to signal or chassis ground shorts in the laser diode array wiring. It should be noted that this trickle current approach also detects laser diode array open circuits, in addition to ground and wiring shorts. In contrast with ground or wiring shorts, in the case of an open circuit, damage to hardware is unlikely because the current path is broken.

FIG. 1 includes a schematic functional block diagram illustrating a low-side linear constant current sink circuit, according to exemplary embodiments. Referring to FIG. 1, low-side linear current sink 100 has an input voltage applied at its VIN input by a variable common potential source 102 at a voltage V1 through an array 104 of light-emitting diodes to be driven. Output light 106 emitted by driven diode array 104 can be used to pump a laser gain medium 108, which can be, for example, a PA gain medium. Low-side linear constant current sink circuit 100 is powered by external +/−voltages, which, in some exemplary embodiments, are +/−15 volts. The current I1 is sinked through low-side linear current sink 100 to the opposite end, i.e., return, of variable common potential source 102, usually system ground (GND). The current level setting input ISET from a digital-to-analog converter (DAC) (not shown in FIG. 1) sets the magnitude of the IOUT current I1, as long as the current enable input EN is active. The current enable input EN must be active to allow the current level setting input ISET to set the IOUT current. If the current enable input EN is inactive, the IOUT current I1 will be zero, regardless of the current level setting input ISET.

The current control output FDBK monitors the absolute value of the IOUT current I1. In exemplary embodiments, the current control output mirrors the commanded current level setting input ISET. The current control output is typically converted to a digital signal via an analog-to-digital converter (ADC) (not shown in FIG. 1). The FDBK digital word and the ISET current pulse amplitude digital command word are compared in a digital controller 124 (see FIG. 2) to ensure the current delivered (FDBK) is equal to the current commanded by ISET.

The headroom monitor output (HRM) monitors the headroom voltage across the pass element via an ADC (not shown in FIG. 1). This headroom voltage is then adjusted on the fly via the variable common potential source 102 to achieve the maximum efficiency, while simultaneously maintaining the linearity of the servo loop. One method for controlling the variable common potential source is via a digital potentiometer (see FIG. 2) controlled by a digital word from the digital controller 124.

Figure 2:
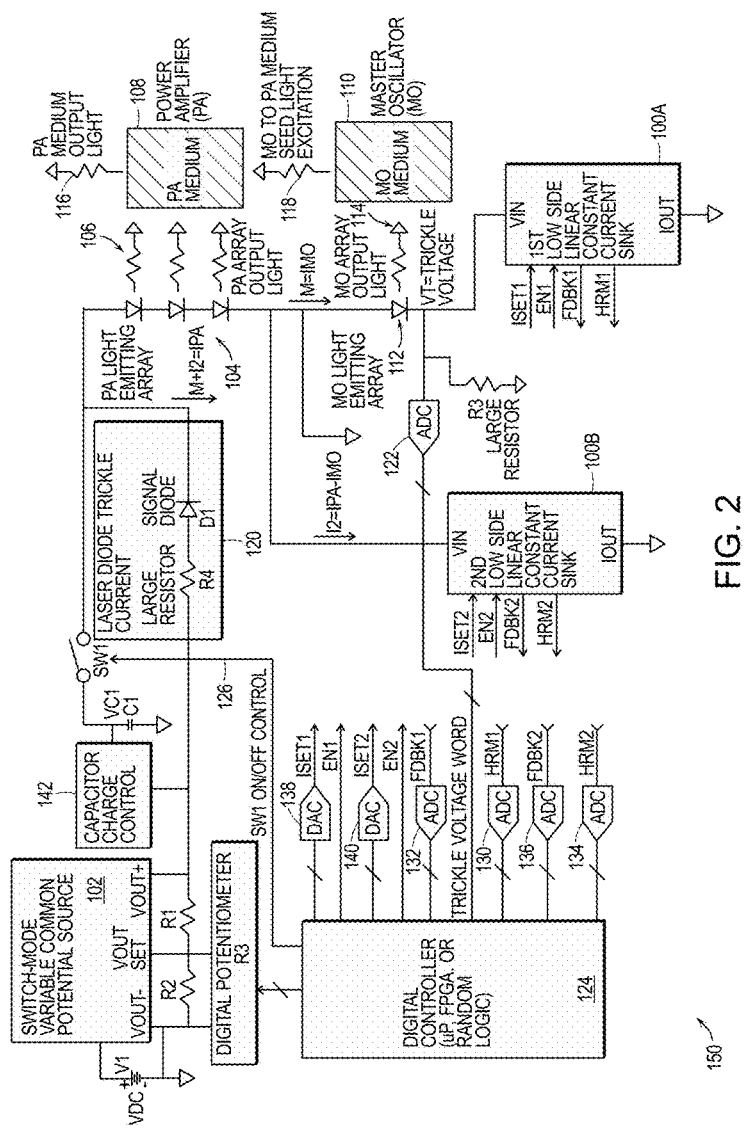
FIG. 2 includes a schematic detailed functional block diagram illustrating a laser diode driver, including two low-side linear constant current sink circuits of FIG. 1, according to exemplary embodiments.

FIG. 2 includes a schematic detailed functional block diagram illustrating a laser diode driver 150, including two low-side linear constant current sink circuits 100A and 100B of FIG. 1, according to exemplary embodiments. FIG. 2 illustrates a low-side MOPA topology for exciting two separate gain media, namely, MO gain medium 110 and PA gain medium 108, powered by a single variable common potential source 102. FIG. 2 illustrates two low-side linear constant current sink circuits 100A and 100B disposed in parallel. It will be understood that additional current sink circuits 100 can be used in parallel to share the I1 and/or I2 load currents. As described above in connection with FIG. 1, series light-emitting array 104 emits output light 106, which excites, i.e., pumps, PA gain medium 108 to produce PA medium output light 116. Similarly, series light-emitting array 112 emits output light 114, which excites, i.e., pumps, MO gain medium 110 to produce MO medium output light 118, which, in the exemplary embodiments, is MO-to-PA seed light excitation, which acts to further excite PA laser gain medium 108 to the desired frequency or color of output light desired. The MO light-emitting array 112 current IMO is equal to I1 of the first low-side linear constant current sink 100A, and the PA light-emitting array 104 current IPA is the sum of I1+I2 from both the first low-side linear constant current sink 100A and the second low-side linear constant current sink 100B. It should be noted that, although the exemplary embodiment illustrates the PA light emitting array 104 and MO light emitting array 112 as including three and one diodes, respectively, it will be understood that either or both of the arrays 104 and 112 can include one or more diodes.

According to exemplary embodiments, laser diode driver 150 also includes a laser diode trickle current circuit 120, as shown, for generating a relatively small trickle current, which flows down through the series laser diode PA light-emitting array 104 and in series with the MO light-emitting array to the top, i.e., VIN input, of first low-side linear constant current sink 100A. In some exemplary embodiments, laser diode trickle current circuit 120 includes a resistor R4, having a relatively large resistance value, in series with a signal diode D1. A typical exemplary embodiment would have R4=10 kilohms, R3=1 megohm, and the variable common potential source equal to 10 volts. By making the high value of the R3 shunt around a value of 1 Megohm, the approximate 10 megohm OFF leakage resistance of the first low-side linear constant current sink at 100 A is essentially swamped out. This would create an approximate trickle current of 10V/1 Meg=10 uA for this particular example. It should be noted at this low value of trickle current the MO and PA laser gain mediums cannot be excited and remain dormant. At this low value of trickle current, the drop across D1 and the MO and PA light-emitting arrays are near zero volts. This puts about 70% to 90% of the variable common potential source voltage at the top of the first linear constant current sink at VIN (about 7V to 9V for this example). When a short or open occurs in either the MO or PA light-emitting diode arrays, the voltage at VIN of the first linear constant current sink falls to near zero volts. To be conservative, any voltage at VIN that is less than about 50% of the value of the variable common potential source is indicative of a failure and the ON/OFF switch (SW1) controlled by the control signal at 126 should be immediately put in and left in the OFF position before initiating any further pulsing. If the variable common potential source goes to, for example, 100V to handle many more laser diode arrays in series, then the resistor values will be adjusted accordingly and the voltage at VIN will be proportionately stepped down to accommodate the input range of the monitoring ADC. The step down circuit is not shown in FIG. 2. The trickle current develops a trickle voltage VT at the VIN input of first low-side linear constant current sink 100A and at the input to ADC 122. ADC 122 converts the trickle voltage to a digital signal, i.e., digital word, and transmits the digital word to a digital controller 124, which controls the operation of laser diode driver 150. In some exemplary embodiments, digital controller 124 can be a microprocessor, microcontroller, field-programmable gate array (FPGA), logic circuitry, or other similar device(s) and/or circuitry. The trickle voltage digital word from the output of ADC 122 is checked by digital controller 124 to determine whether the trickle voltage VT indicates a short circuit. If a short circuit is indicated, digital controller 124 issues a command via control line 126 to control switch SW1 to remain in the open or OFF state. With switch SW1 open, the low-side MOPA is prevented from firing, thus preventing damage which could be caused by short circuit current.

Continuing to refer to FIG. 2, as noted above, digital controller 124 controls the operation of laser diode driver 150. To that end, signals HRM1 and FDBK1 from first low-side linear constant current sink 100A described above are received and digitized by ADCs 130, 132, respectively. The digitized signals are received and processed by digital controller 124 in accordance with the detailed description herein. Similarly, signals HRM2 and FDBK2 from second low-side linear constant current sink 100B described above are received and digitized by ADCs 134, 136, respectively. The digitized signals are received and processed by digital controller 124 in accordance with the detailed description herein. Control signals EN1 and ISET1 are generated by digital controller 124 and forwarded to first low-side linear constant current sink 100A. Control signal ISET1 is converted by DAC 138 before forwarding to first low-side linear constant current sink 100A. Similarly, control signals EN2 and ISET2 are generated by digital controller 124 and forwarded to second low-side linear constant current sink 100B. Control signal ISET2 is converted by DAC 140 before forwarding to second low-side linear constant current sink 100B.

Continuing to refer to FIG. 2, as noted above, switch-mode variable common potential source 102 generates the power applied to circuitry in diode driver 150. The voltage of the applied power is set by a resistor network, which includes resistors R1, R2 and R3. Resistor R3 can be, for example, a digital potentiometer, the resistance of which is settable by a digital control signal or word from digital controller 124, such that the digital controller 124 controls the voltage level output from the applied driving power, i.e., the common potential source. This is accomplished as shown in FIG. 2, by varying the resistance from the VOUT SET pin of the common potential source to ground or VOUT. Other types of variable common potential sources with different output voltage controlling mechanisms are possible. FIG. 2 illustrates one of many possible implementations within the scope of the present disclosure.

Capacitor C1 is charged by common potential source 102 via the capacitor charge control block 142 during the SW1 OFF time, i.e., the pulse duty cycle OFF time. The capacitor charge control 142 can be as simple as a high-power charging resistor or as complex as a switch-mode active line filter (ALF) to minimize input current ripple presented to the common potential source 102. The choice of capacitor charge control 142 is a trade-off between cost, complexity, noise, and desired input current ripple magnitude presented to the common potential source. When it is time to pulse the laser diodes, SW1 is placed in the ON position such that the commanded pulsed driving current set by ISET 1 and ISET 2 and enabled by EN1 or EN2 is drawn from capacitor C1 during the current pulse driving operation. The size of C1 should be made large enough so that the droop during pulse ON time is less than 1% of the pre-pulse value, which is nearly equal to the common potential source output, when C1 is fully charged. This can result in a fairly large capacitor at C1 for large-amplitude pulsed currents with wide pulse widths. The voltage on C1 is nearly equal to the output of the common potential source provided the power charging resistor internal to the capacitor charge control 142 is small enough to charge C1 to the full output of the common potential source during the duty cycle OFF time. This can be greater than 5 RC time constants. Under the control of digital controller 124, the output of the common potential source can be varied up or down to control the capacitor charge voltage VC1 to keep the first low-side linear constant current sink headroom (HRM1) as low as practical for maximum efficiency, while simultaneously keeping the pass element in its linear range, which is referred to herein as adaptive low drop out (ALDO) on-the-fly regulation.

Figure 3:
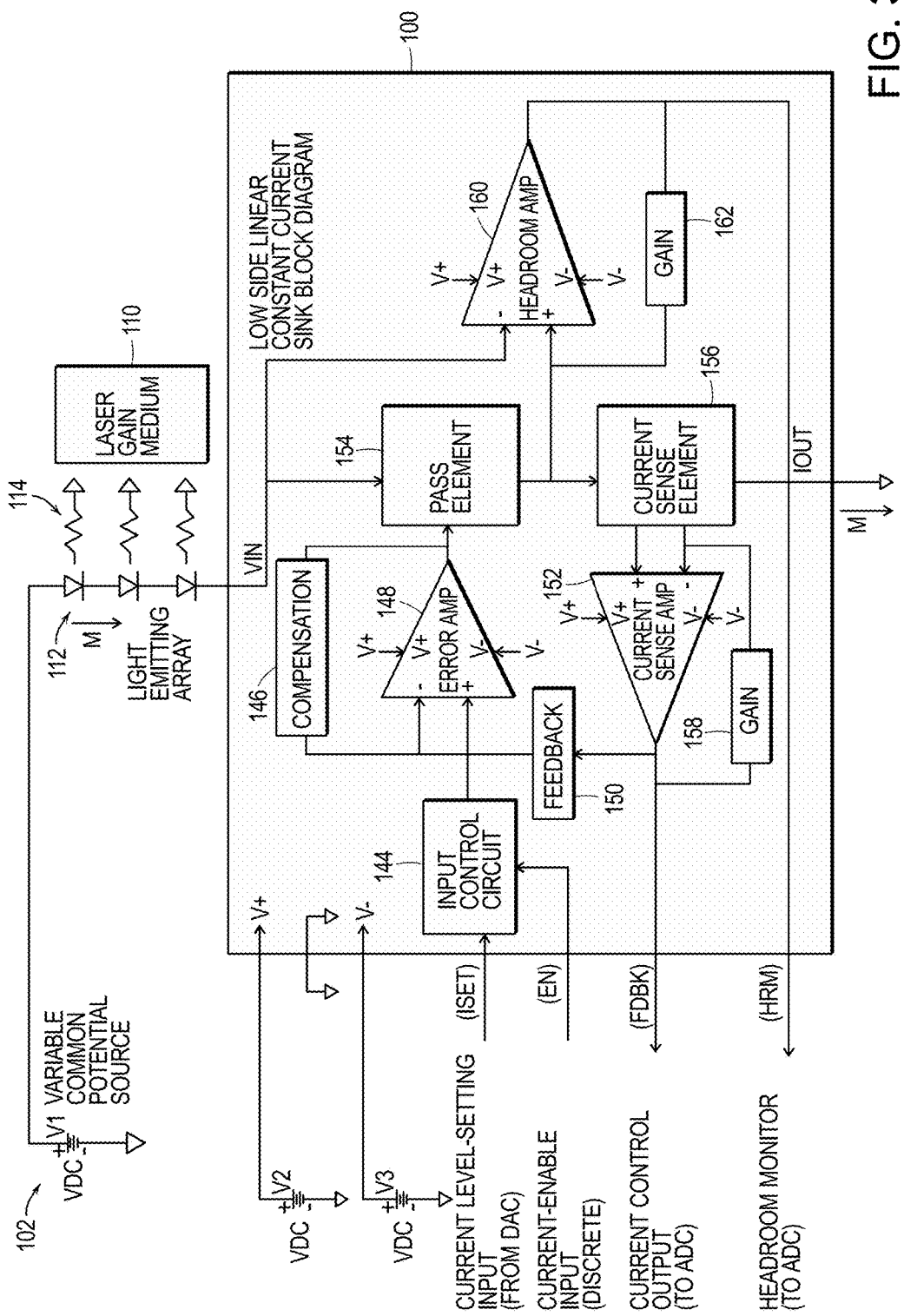
FIG. 3 includes a schematic detailed functional block diagram illustrating a low-side linear constant current sink circuit illustrated in FIG. 1, according to exemplary embodiments.

FIG. 3 includes a schematic detailed functional block diagram illustrating a low-side linear constant current sink circuit illustrated in FIG. 1, according to exemplary embodiments. Specifically, FIG. 3 illustrates the internal blocks of a precision, voltage-controlled, low-side, linear, constant current sink 100 for sinking hundreds of amps of current through a single series light-emitting array of laser diodes, according to exemplary embodiments.

Referring to FIGS. 2 and 3, current is provided, i.e., sinked, at input VIN of low-side linear constant current sink 100 from variable common potential source 102, through light-emitting array 112, the output light 114 of which pumps laser gain medium 110. In some embodiments, positive power supply voltage V+ referenced to common ground is provided by a voltage source V2, and negative power supply voltage V− referenced to common ground is provided by a voltage source V3. V2 and V3 are the supply voltages used to power the internal circuitry of the low-side linear constant current sink 100. In a high-side linear current source design, these supply voltages are created internally with a noisy and floating switch-mode supply, thus making the high-side design significantly more complicated and unreliable, as compared to the low-side design. Current level setting input ISET and current enable input EN are received at an input control circuit 144, the output of which is applied to the non-inverting input of an error amplifier 148. Input voltage VIN is applied to a pass element 154, which can be, for example, one or more power MOSFETs, power bipolar transistors, or similar devices. Input voltage VIN is also applied to the non-inverting input of headroom amplifier 160. The output of pass element 154 is applied to the inverting input of headroom amplifier 160 and to an input of current sense element 156. In some exemplary embodiments, current sense element 156 can be, for example, a four-terminal milliohm sense resistor, current sense transformer, or similar device. Headroom amplifier 160 includes a gain element 162 between its inverting input and its output. The output of headroom amplifier 160 is the headroom monitor signal HRM transmitted to digital controller 124 via an ADC 130, 134. The HRM1 and HRM2 headroom monitor signals are a proportional measure of the voltage across the pass element. If this voltage becomes too large, the efficiency of the linear constant current sinks suffer. If this voltage becomes too small, the pass element falls out of its linear ranged and into its non-linear or switching range.

Continuing to refer to FIGS. 2 and 3, outputs of current sense element 156 are applied across the inverting and non-inverting inputs of current sense amplifier 152, which includes a gain element 158 across its inverting input and its output. The current sense element 156 can be a 4-wire milliohm current sense resistor or a current sense transformer or some equivalent device. The output of current sense amplifier 152 is the current control output signal FDBK provided to digital controller 124 via ADCs 132, 136 and is a proportional measure of the amplitude of the actual current pulse being sinked. The output of current sense amplifier 152 is also applied to the inverting input of error amplifier 148 via feedback circuit 150. Error amplifier 148 includes a compensation circuit 146 across its inverting input and its output, which is applied as an input to control the ON resistance of pass element 154.

As illustrated in FIGS. 2 and 3, in exemplary embodiments, low-side linear constant current sink 100 is a closed-loop, negative-feedback servo loop, which amplifies the difference between the current sense amplifier 152 feedback voltage and the current level-setting input ISET from external DACs 138, 140. The low-side linear constant current sink 100 is a less complex and costly device than a high-side linear constant current source. One reason for this is that it eliminates the need for a floating switch-mode isolated power supply. Generally, the tradeoff is that a low-side constant current sink is more susceptible to light-emitting array damage due to wiring shorts. However, this drawback is mitigated by the present embodiments with the use of the trickle voltage and headroom monitoring of the pass element voltage. According to the exemplary embodiments, the light-emitting array current I1 is proportional to the current level-setting input ISET, provided the current enable input EN is in the active state. If the current enable input EN is inactive, the current enable input EN forces I1 to zero current, regardless of the current level-setting input ISET. Headroom amplifier 160 continuously monitors the headroom voltage HRM across pass element 154 and adjusts variable common potential source V1 accordingly via digital controller 124 to keep pass element 154 barely in its linear region for maximum power efficiency. The current control output FDBK continuously monitors the absolute value of the light-emitting array current I1 to check if its value matches the commanded current level-setting input ISET. The FDBK signal is input for monitoring and processing to digital controller 124 via ADCs 132, 136.

Figure 4:
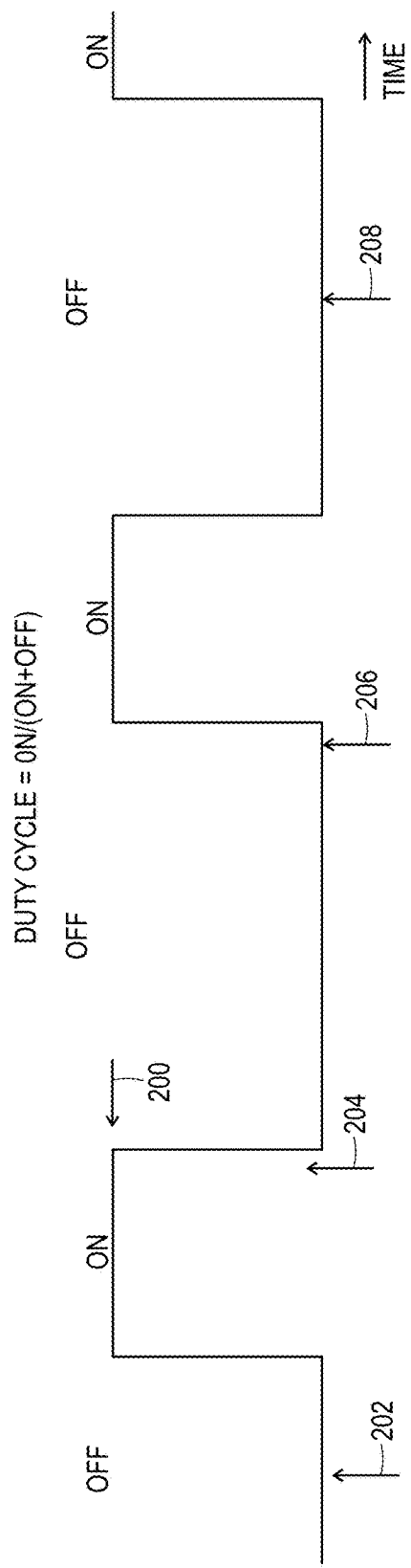
FIG. 4 includes a schematic timing diagram of laser diode array current pulses in connection with trickle current and adaptive low drop-out (ALDO) regulation, according to exemplary embodiments.

FIG. 4 includes a schematic timing diagram of laser diode array current pulses in connection with trickle current and adaptive low drop-out (ALDO), regulation, which involves headroom monitoring and adjustment of the output voltage from the common potential source, according to exemplary embodiments. Referring to FIG. 4, it is noted that the current pulse amplitude 200 is illustrated as an arbitrary "active state" value. It will be understood that voltage levels of timing signals would be compatible with the particular circuitry used to implement the system. It is also noted that the signal of the timing diagram of FIG. 4 is periodic, having an ON time and an OFF time during each period. The duty cycle of the signal is defined as the ratio of the ON time to the total of the ON time and the OFF time during each period, i.e., Duty Cycle=ON/(ON+OFF).

Referring to FIG. 4, in exemplary embodiments, at time 202, at initial power-on, trickle voltage VT is sensed for an in-range, i.e., acceptable reading of no wiring shorts or light-emitting array opens, prior to controlling switch SW1 (shown in FIG. 2) to its closed position. When the switch SW1 is closed to the ON position, current pulsing can proceed. At time 204, during a current pulse ON time, pass element headroom is sensed near or as close to the end of the ON time as practical. This compensates for any storage capacitor C1 droop that may occur during current pulse discharge. At time 206, trickle voltage VT is sensed near the end of the OFF time, in consideration of the possibility that an intermittent ground short may have occurred during the OFF time. If the reading by digital controller 124 is out of range and, therefore, indicates a short or open, switch SW1 is commanded to the open or OFF position, and the enable inputs to the first and second low-side linear current sinks are de-activated, such that current pulsing is at least temporarily stopped, until the short or open can be troubleshot and fixed. At time 208, pass element headroom is adjusted via digital potentiometer R3 (shown in FIG. 2) or some equivalent variation method during the OFF time and before the start of a next ON time either up or down to compensate for variations in the first and second light-emitting arrays and their associated circuitry.

Figure 5:
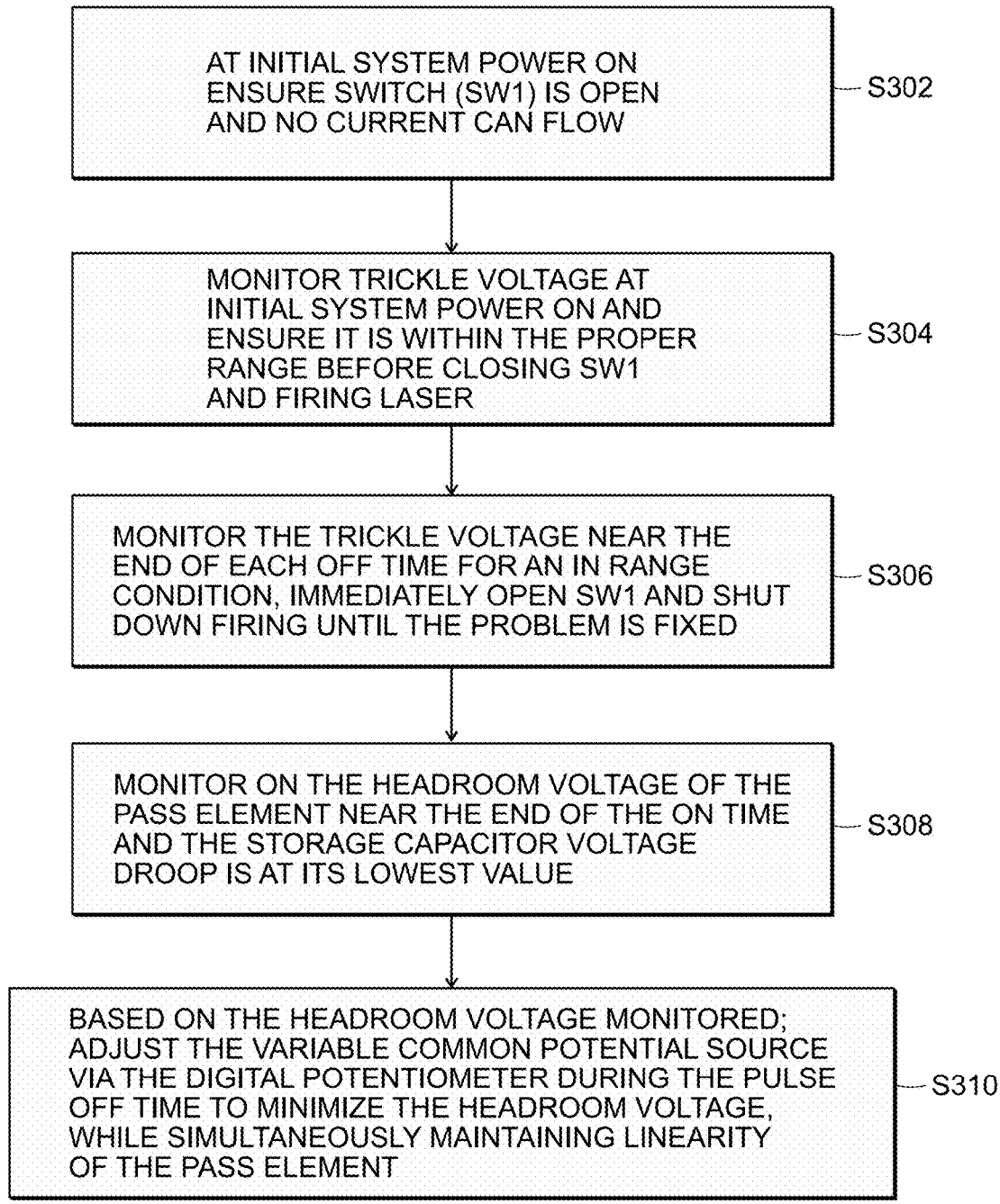
FIG. 5 includes a schematic logical flow diagram illustrating logical flow of laser diode array current pulse control in connection with trickle current and adaptive LDO (ALDO) regulation, according to exemplary embodiments.

FIG. 5 includes a schematic logical flow diagram illustrating logical flow of laser diode array current pulse control in connection with trickle current and adaptive low drop-out (ALDO) regulation, according to exemplary embodiments. Referring also to FIG. 2, the flow diagram of FIG. 5 illustrates steps taken by digital controller 124 in performing operational tasks of driver 150 described herein in detail. Referring to FIG. 5, in step S302, at initial system power on, it is confirmed that switch SW1 is open such that no current can flow. Next, in step S304, trickle voltage VT is monitored at initial system power on to ensure that VT is within the proper range, indicating no wiring shorts or light-emitting array opens, before switch SW1 is closed to allow current pulsing. Next, in step S306, after current pulsing has begun, trickle voltage VT is monitored near the end of each OFF time for an in-range condition, indicating no wiring shorts or light-emitting array opens. If an out-of-range condition is detected, SW1 is opened immediately, a failure notification is issued, and current pulse firing is commanded to cease until the failure condition is eliminated, such as by repair of a wiring short. In step S308, headroom voltage of the pass element 154 is monitored near the end of an ON time and the storage capacitor C1 voltage droop is at its lowest value. At step S310, based on the headroom voltage monitored, the output voltage of variable common potential source 102 is adjusted by digital controller 124 via digital potentiometer R3 during the pulse OFF time to minimize the headroom voltage, while simultaneously maintaining linear operation of pass element 154.

According to the exemplary embodiments, by monitoring trickle voltage VT with digital controller 124, a wiring ground short or light-emitting array open can be detected. If the trickle charge word from the output of the trickle voltage ADC 122 is at or near zero, then it is concluded that a wiring ground short exists, and digital controller 124 can be programmed to take action not to close SW1 and discharge C1 through the laser diodes above the short. Also, the system can be flagged by digital controller 124 that a wiring ground short or light-emitting array open has occurred. According to exemplary embodiments, only one trickle current circuit and one ADC are required to implement this technique. This is because, to detect a ground short, it is only necessary to monitor the top of the current sink at the bottom of the entire laser diode array, i.e., the first low-side linear current sink 100A in FIG. 2; it is not necessary to monitor other locations in the circuitry. In some particular exemplary embodiments, digital controller 124 may be programmed to check that trickle voltage VT is not near zero volts or below 70% of the variable common potential output voltage prior to every attempt to close SW1 and deliver a current pulse. In some exemplary embodiments, the fail level for VT is set at below 70% for example of the variable common potential source output voltage because the short or open may not be a complete or "hard" short of open. For example, the short may be a low-resistance short to ground, rather than a zero-ohm short to ground. Similarly, the open circuit in the first and second light-emitting arrays may not have infinite resistance, but may be some finite resistance, 10 kilohms, for example.

According to some exemplary embodiments, the use of low-side drive with trickle current monitoring described herein in detail is not limited to MOPA designs. It should be noted that the embodiments described herein are applicable to other architectures, for example, PO, MOPAPA, and other configurations.

According to some exemplary embodiments described herein in detail, by directing a trickle current through a series laser diode array with a small current, which, in some embodiments is on the order of micro-amps, using a relatively uncomplicated charging circuit; the voltage at the top of the low side constant current sink connected to the bottom of the series laser diode array is the voltage monitored for the existence of wiring ground shorts or light-emitting array opens in the MO and PA laser diode arrays. In some exemplary embodiments, if the monitored trickle voltage VT is at or near zero volts, a wiring ground short or light-emitting array open somewhere within the series laser diode array is indicated. On the other hand, in some exemplary embodiments, if the trickle voltage VT is significantly above zero volt at, for example, above about 70% of the variable common potential source output, but below the output of the variable common potential source 102, no wiring ground short or light-emitting array open in the series laser diode array is indicated. Thus, if the trickle voltage is below a predetermined threshold value, e.g., about 70% of the variable common potential source output voltage, a "soft" ground short or a "soft" open in the laser array is indicated. What is meant by "soft" herein is that the short or open in the light-emitting array has a finite impedance associated with it and is not a zero-ohm short or an infinite-ohm open. If the trickle voltage is above the predetermined threshold value, no ground short or light-emitting array open in the laser array is indicated.

It should be noted that, in some exemplary embodiments, when the trickle current is in the micro-amp range, the drop across the light-emitting array individual laser diodes is quite small and substantially less than the approximate 2V drop, when hundreds of amps are flowing through them. If the voltage VT at the top of the first low-side linear current sink is above 70% of the voltage charged on the storage capacitor at C1, then there is no short or open failure in the MO or PA light-emitting arrays. If the VT voltage at the top of the low-side linear current sink is from 0% to 70% of the voltage charged on C1, then there is a "soft" or "hard" short or open somewhere in the light-emitting array wiring, or perhaps a laser diode has opened up for some reason. In this case, the ON/OFF switch remains in the OFF position until the failure is discovered and fixed.

Thus, according to exemplary embodiments, driving a trickle current down through the laser diode string is used to detect soft and hard ground shorts and to prevent those ground shorts from damaging the expensive laser diode string, when low side linear constant current sink drive is used. Also, according to exemplary embodiments, as described above in detail, adaptive, i.e., "on the fly," low drop-out (ALDO) regulation of pass element 154 headroom is used to minimize the power dissipation in the low-duty-cycle first low-side linear constant current sinks at the bottom of the first PA and second MO light-emitting arrays.

According to the exemplary embodiments, adaptive LDO (ALDO) regulation is an important feature, particularly where, as in the present embodiments, linear low side constant current sinks 100 are used to drive hundreds of amps down through a laser diode string used in PO, MOPA, MOPAPA, and other type architectures. Unlike fixed LDO, which is an established method for minimizing power dissipation in linear regulators, adaptive LDO of the present embodiments monitors the pass element 154 headroom on the fly, on every pulse cycle through an ADC 130, 134. During the high-current pulse ON time, the resulting digital word from the ADC 130, 134 is input to digital controller 124, where, during the OFF time of the pulsed duty cycle, digital controller 124 outputs a digital control word to digital potentiometer R3, which in turn controls the voltage output from variable common potential source 102 to maintain pass element 154 headroom at the minimum necessary for linear servo loop operation. In this way, along with a relatively low duty cycle, power dissipation can be kept reasonably low. In some embodiments, power dissipation is so low that heat sinks are not required.

Adaptive LDO (ALDO) regulation along with a relatively "low duty cycle" pulsed operation is a suitable approach for laser range finders, because the low noise "linear" approach coupled with the low average power dissipation works well without the need for a large heat sink.

While the present teachings have been described above in terms of specific embodiments, it is to be understood that they are not limited to these disclosed embodiments. Many modifications and other embodiments will come to mind to those skilled in the art to which these present teachings pertain, and which are intended to be and are covered by both this disclosure and the appended claims. It is intended that the scope of the present teachings should be determined by proper interpretation and construction of the appended claims and their legal equivalents, as understood by those of skill in the art relying upon the disclosure in this specification and the attached drawings.

The invention claimed is:

1. A multi-stage laser drive circuit configured to draw current from a variable common potential source, comprising:
 a current node;
 a first power amplifier (PA) light-emitting array in electrical communication between a storage capacitor and the current node through a digitally controllable ON/OFF switch, the storage capacitor being charged by the variable common potential source through a charge control circuit;
 a first low side linear current sink in electrical communication with the current node, the first low side linear current sink being configured to draw a first current (I1) from the storage capacitor through the ON/OFF switch, through the current node;
 a second low side linear current sink in electrical communication with the current node and in a parallel arrangement with respect to the first low side linear current sink, the second low side linear current sink being configured to draw a second current (I2) from the storage capacitor through the ON/OFF switch, through the current node;
 a second master oscillator (MO) light-emitting array in electrical communication between the current node and the first low side linear current sink, wherein current through the first light-emitting array is the sum of the first and second currents in parallel, wherein output light from the first PA light-emitting array is used to pump a first PA laser gain medium; wherein output light from the second MO light-emitting array is used to pump a second MO laser gain medium;
 a trickle current circuit located between the common potential source and an anode of a laser diode at a top of the first PA light-emitting array for driving a low-value trickle current through the first and second light emitting arrays and through a fixed shunt resistor in parallel with the first low side linear current sink;
 a sense circuit for sensing a voltage indicative of a magnitude of the trickle current at an input of the first low side linear current sink and generating a signal indicative of the voltage; and
 a digital controller for generating a switch control signal to control the ON/OFF switch such that the first and second currents are prevented from flowing if the signal indicative of the trickle voltage indicates that the trickle voltage is outside a voltage range to indicate a malfunction, the malfunction being one of an open circuit and a short circuit, indicated by the trickle voltage;
 wherein the first low side linear current sink contains a pass element and a second sense circuit, the second sense circuit sensing a voltage across the pass element and generating a signal indicative of the voltage across the pass element, the digital controller monitoring the voltage via an analog-to-digital converter (ADC) and generating a digital control signal to vary an output of the common potential source to control the voltage across the pass element to an absolute minimum during the current pulse ON time, while maintaining pass element linearity.

2. The multi-stage laser drive circuit of claim 1, wherein the first and second currents are arbitrary-waveform pulsed currents of low duty cycle, each pulse period comprising an ON time during which the current is controllable to flow as an arbitrary wave shape and an OFF time during which the current is controllable not to flow, each current being controllable by commands from the digital controller.

3. The multi-stage laser drive circuit of claim 1, wherein the trickle current circuit comprises a single resistor or resistor/diode combination circuit between the common potential source and the top of the first PA light-emitting array, the trickle current being used for testing status of both the first and second light-emitting arrays.

4. The multi-stage laser drive circuit of claim 1, wherein the sense circuit comprises an analog-to-digital converter (ADC), which creates a trickle voltage digital value which is a proportional digital representation of the trickle voltage created by the trickle current flowing through the first low side linear current sink and the paralleled shunt resistor during the OFF time of the first low side linear current sink.

5. The multi-stage laser drive circuit of claim 4, wherein the trickle voltage digital value is input to the digital controller, which determines if the trickle voltage is within a PASS or FAIL range to indicate a good or bad condition of at least one of the first PA light-emitting array and the second MO light emitting array.

6. The multi-stage laser drive circuit of claim 5, wherein, if the trickle voltage digital value is in the FAIL range, the digital controller turns OFF the digitally controllable ON/OFF switch to shut down all current pulsing of the first and second light-emitting arrays.

7. The multi-stage laser drive circuit of claim 1, wherein the pass element comprises at least one of a Metal Oxide Semiconductor Field Effect Transistor (MOSFET), an Insulated Gate Bipolar Transistor (IGBT), and a similar device.

8. The multi-stage laser drive circuit of claim 7, wherein the voltage across the pass element is the source-drain voltage of the MOSFET or collector-emitter voltage of the IGBT and is monitored by a second analog-to-digital converter (ADC) and is input to the digital controller as a headroom monitor (FIRM) signal, a voltage of the HRM and the voltage across the pass element being linearly related by a gain stage, the gain stage making the voltage across the pass element being compatible with the second ADC.

9. The multi-stage laser drive circuit of claim 8, wherein the source-drain voltage of the MOSFET or collector-emitter voltage of an IGBT or similar device is monitored during every pulse cycle ON time and controlled on the fly during every pulse cycle OFF time such that the MOSFET, IGBT, or equivalent device operate in their linear operational mode at the lowest pass element Voltage possible for maximum efficiency.

10. The multi-stage laser drive circuit of claim 1, wherein monitoring of the trickle voltage via its sense circuit is conducted during each OFF time of the current pulse cycle, as close to the beginning of the pulse firing time of the light-emitting array as possible; and monitoring of the headroom voltage via its sense circuit is conducted during each ON time of the current pulse cycle, as close to the end of the pulse ON time as practical to compensate for storage capacitor droop.

\* \* \* \* \*